(12) United States Patent
Yatskov et al.

(10) Patent No.: US 6,336,816 B1
(45) Date of Patent: Jan. 8, 2002

(54) ELECTRICAL CIRCUIT CONNECTOR WITH SUPPORT

(75) Inventors: Alexander I. Yatskov, Kenmore; Mario L. Jaena, Kent, both of WA (US)

(73) Assignee: Cray Inc., Seattle, WA (US)

( * ) Notice: Subject to any disclaimer, the term of this patent is extended or adjusted under 35 U.S.C. 154(b) by 0 days.

(21) Appl. No.: 09/619,566

(22) Filed: Jul. 19, 2000

(51) Int. Cl.⁷ .............................................. H01R 12/00
(52) U.S. Cl. ........................................ 439/67; 439/493
(58) Field of Search ............................ 439/67, 77, 493

(56) References Cited

U.S. PATENT DOCUMENTS

| | | | | |
|---|---|---|---|---|
| 3,319,216 A | * | 5/1967 | McCullough | 439/493 |
| 3,356,983 A | * | 12/1967 | Johnson, Jr. | 439/67 |
| 4,227,767 A | * | 10/1980 | Mouissie | 439/493 |
| 5,211,577 A | * | 5/1993 | Daugherty | 439/493 |
| 5,730,619 A | * | 3/1998 | Hamlin | 439/493 |
| 5,971,806 A | * | 10/1999 | Evans et al. | 439/67 |

OTHER PUBLICATIONS

Pokrzywa, R.S., "A High Density Pad–On–Pad Connector Utilizing a Flexible Circuit," pp. 461–464, Copyright 1993.
Ling, Y. et al., "Finding the Constitutive Relation for a Specific Elastomer," presented at the Winter Annual Meeting, American Society of Mechanical Engineers, Anaheim, Ca, Nov. 8–13, 1992.

* cited by examiner

Primary Examiner—Tho D. Ta
(74) Attorney, Agent, or Firm—Seed IP Law Group PLLC

(57) ABSTRACT

A method and apparatus for coupling electrical connectors to a printed circuit board. The first and second clamp member are held in an open position with electrical connectors therebetween. While in the open position, the clamp is positioned over a printed circuit board, with the first and second clamp members aligned for connection to the circuit board. The clamp is then partially closed, to a preloaded position which aligns the electrodes in the clamping assembly with the electrodes on the circuit board. After the initial alignment has occurred, the clamp is firmly fastened to the printed circuit board, to electrically couple the electrodes of the connectors and the clamp to the electrodes on the printed circuit board.

22 Claims, 6 Drawing Sheets

ELECTRICAL CIRCUIT CONNECTOR WITH SUPPORT

TECHNICAL FIELD

This invention relates to electrical connectors, and more particular to electrical connectors for coupling circuits on printed circuit boards.

BACKGROUND OF THE INVENTION

Many computing devices, such as desktop computers, workstations, main-frame and super-computers employ multiple printed circuit boards ("PCB") that include various microprocessors, printed circuits and other components that must be electrically coupled together to transmit data and/or power. The electrical traces on one or more layers of the PCB form the printed circuits and typically terminate in one or more terminals or contacts for making connections. Every decreasing element sizes, such a pitch (i.e., the spacing between successive components), width, and height, exacerbate the problem of providing secure and reliable connections between the printed circuits. Precise positioning on the order of thousandths of an inch is often necessary. Consistent pressure across each of the many contacts is also desirable to assure a reliable connection. A single failed or intermittent connection can result in large amounts of "down-time" for the computing device, and costly trouble-shooting by highly skilled technicians.

Highly parallel processing super-computers present a particularly significant problem in terms of space constraints. Super computers rely on a high number of connections between circuit boards that each carry one or more microprocessors. The nature of parallel processing places high demands on the timing of signals, including clock signals across the various computer components. The PCBs are spaced relatively close together to reduce the length of the connections between the PCBs in an effort to improve the timing of the signals. The tight spacing hinders the ability of technicians to access particular computer components, such as the PCBs and electrical connectors. This presents a particular problem to computer manufacturers and owners who desire a modular design that permits failed components to be quickly and easily replaced. If serviceable, a modular design would also permit the addition of new or additional processors as desired, for example when more processing power is required or when the processors become more affordable. This could significantly extend the life of the computing device.

SUMMARY OF THE INVENTION

According to principles of the present invention, a clamp for an electrical connector to a printed circuit board is structured to provide quick and accurate connection.

The electrical connector is positioned inside the clamp and has electrodes organized in a pattern for contact with the printed circuit board. The clamping assembly which holds the electrical connector has alignment members to ensure precise and accurate alignment with the printed circuit board. In order to provide quick attachment and release, the clamp assembly has three positions during the clamping and unclamping sequence. In a first position, the clamp is fully open and the electrical connector is held in the position so that it may be placed over a printed circuit board in preparation for attachment. In a second configuration, the clamping assembly is clipped into a preloaded position to properly align the electrical connectors and hold the clamping assembly into position for final attachment. In the third, final attachment stage, the clamping assembly is solidly connected to the printed circuit board with rigid bolts extending through the clamp assembly, through the printed circuit board and to a clamping member in the clamp assembly so as to hold the electrodes on the electrical connectors in complete electrical contact with the electrodes on the printed circuit board.

The clamp assembly may be easily attached and removed from the printed circuit board with high reliability. All electrical connections between electrodes will be properly made and that it can be quickly removed without damage to the electrical contacts.

BRIEF DESCRIPTION OF THE DRAWINGS

In the drawings, identical reference numbers identify similar elements or acts. The sizes and relative positions of elements in the drawings are not necessarily drawn to scale and various elements and portions of elements may be are arbitrarily enlarged and positioned to improve drawing legibility.

DETAILED DESCRIPTION OF THE INVENTION

Figure 1:
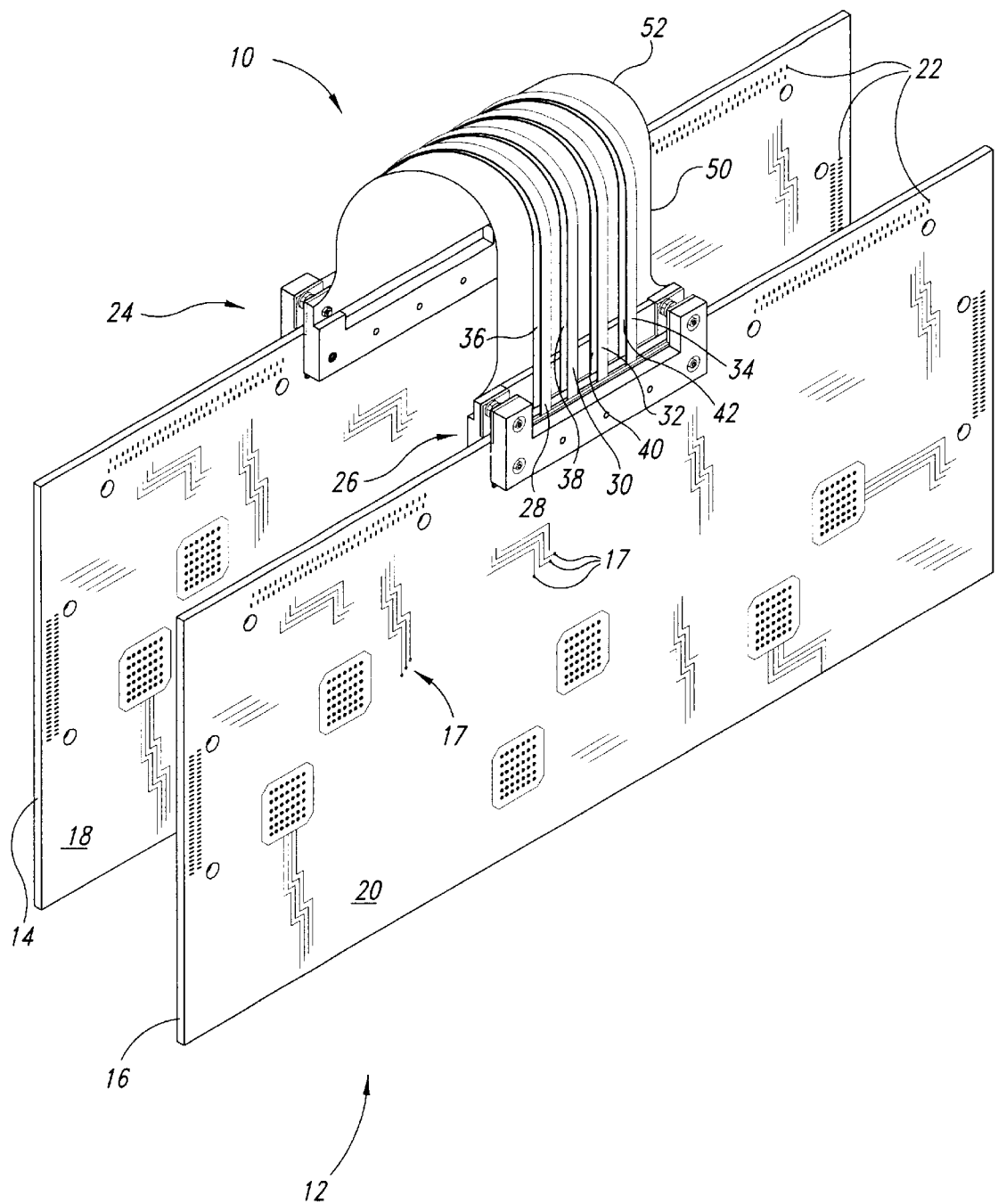
FIG. 1 is an isometric view of a connector according to the present invention coupling a pair of circuits on two printed circuit boards in side-by-side relation.

FIG. 1 shows a connector 10 coupling printed circuit boards 12 ("PCBs") according to the present invention. The connector 10 includes a first and second clamps 24, 26, and a first set of electrical connectors, such as four flexible circuit substrates 28–34, electrically coupling circuits on the first PCB 14 to circuits on the second PCB 16. The connector 10 also includes a flexible support member 50 that provides mechanical support and stability to the connection.

Figure 2:
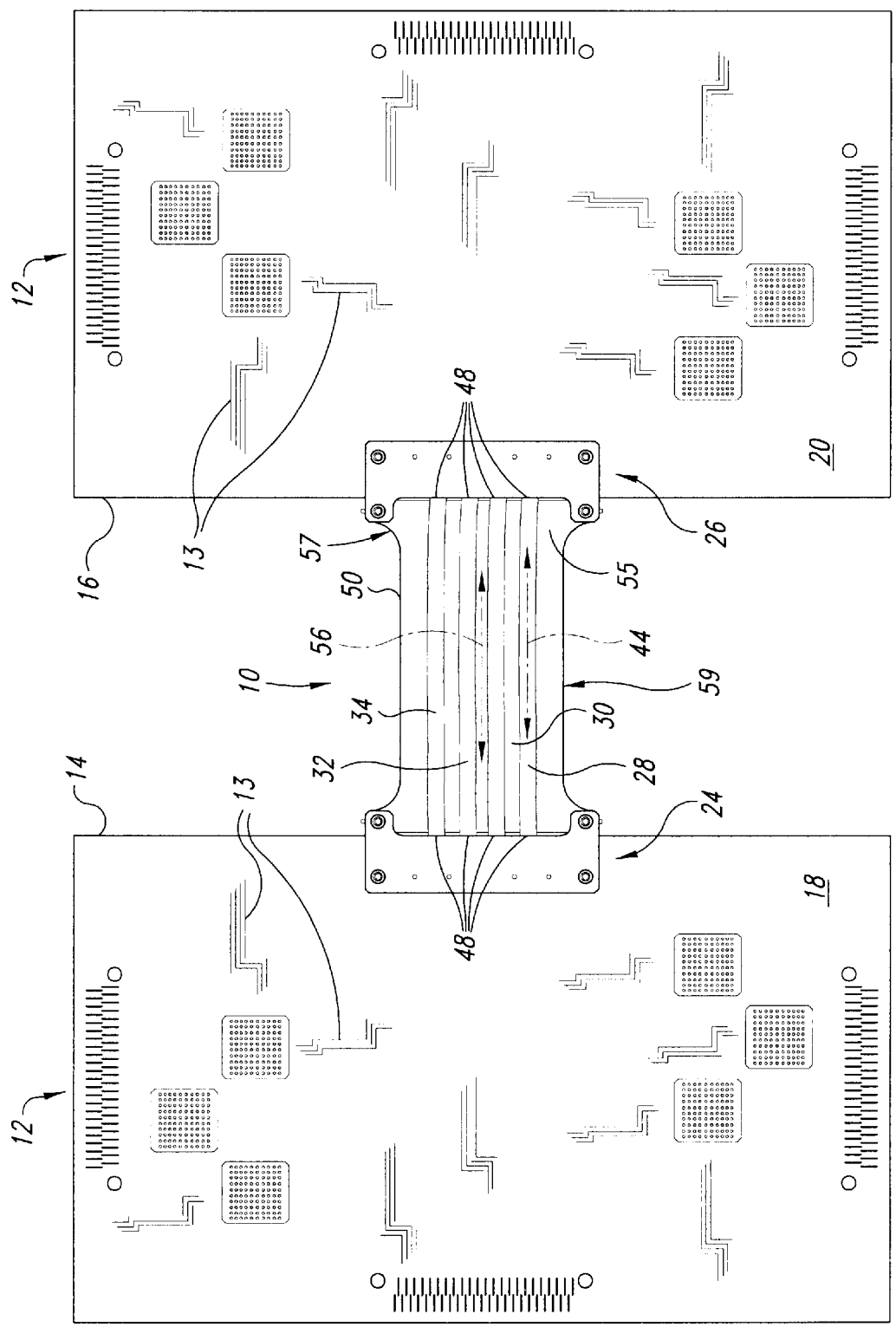
FIG. 2 is a top plan view of the connector according to the present invention coupling a pair of circuits on two printed circuit boards in parallel relation.

FIG. 1 shows the first printed circuit board ("PCB") 14, and the second PCB 16, in a side-by-side, parallel arrangement. FIG. 2 shows the connector 10 coupling circuits on the first and second PCBs boards 14, 16, where the PCBs 14, 16, are in the same plane. The circuit boards are of a type used in a super computer or large mainframe computer. Thus, each board will have many electronic components, including many microprocessors. A single computer may have a dozen or more boards with different positions with respect to each other that must be connected. While parallel and side-by-side connections are shown, they may also be stacked, one above another or be arranged in some other configuration.

The PCBs 12 are formed from one or more layers of an insulating material, such as FR-4 epoxy-fiberglass laminate.

The PCBs 12 are typically sufficiently thick to form a rigid substrate, although minor amounts of bending or deflection can occur. The printed circuits include electrically conductive circuit traces 13 and various electrical and electronic components (not shown) on one or both surfaces 18 and 20. Each layer of the PCB 14, 16 can also carry circuit traces (not shown) where the PCB 14, 16 is a laminate structure. Through-holes 17 can provide connections between circuit traces 13 on outer surfaces 18, 20 and/or inner layers of the PCB 14, 16. The printed circuits include electrical contacts 22 to coupled the printed circuits to other electrical circuits. The electrical contacts 22 are located close to the edges of the PCB 14, 16 to make the coupling easier.

Figure 3:
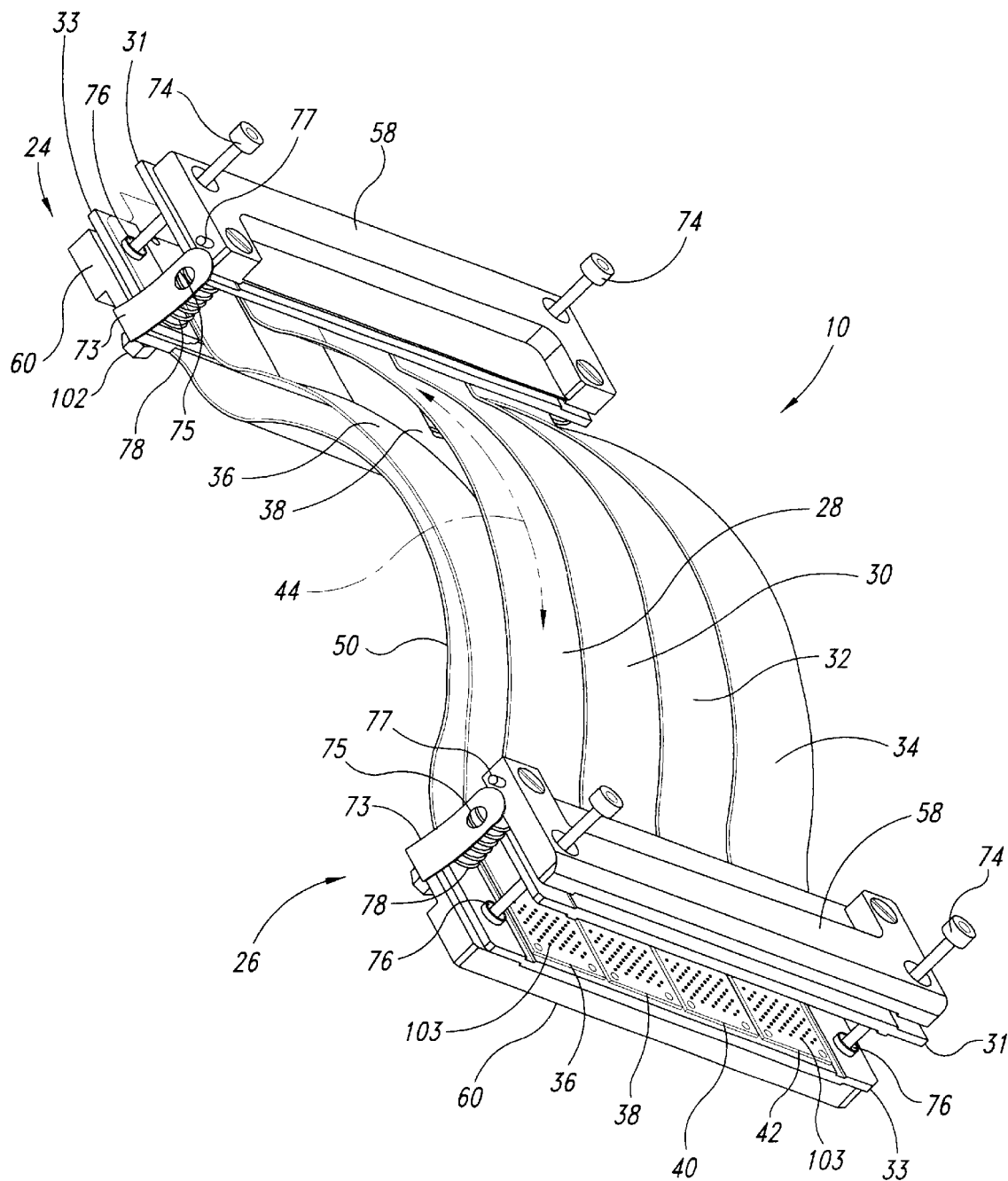
FIG. 3 is a top, isometric view of the inventive connector.

Electrical conductors 28–34 extend into the clamps and have exposed electrodes 103 for connecting to electrodes contacts on the printed circuit board (see FIG. 3). The details of this electrical connection need not be described here since other types of electrical contacts can be used within the concept of this invention.

The electrical connectors 28–34 can be of any acceptable type. Ribbon cable strips, electrical cables, or flexible circuit substrates can be used. The invention is particularly helpful with ribbon strips and flexible substrates as will now be explained. Use of flexible circuit substrates 28–34 provide low resistance, low impedance connections. Such electrical connectors are particularly desirable in parallel processing systems, where the timing of signals is critical. The flexible circuit substrates 28–34 include electrical traces formed on one or more layers (approximately 2–8) of insulated substrate material. The substrate can be printed circuit board material (e.g., polyimide film, FR-4 epoxy-fiberglass laminate), or any acceptable alternatives. The resulting substrate is highly flexible, hence convenient for making connections in tight spaces and/or at an angle and yet is quite strong.

Over-flexing of electrical connectors, such as ribbon cables and flexible circuit substrates can lead to defects in electrical conductors and traces and/or layers thus causing open circuits and/or short circuits. The flexible circuit substrates 28–34 are particularly susceptible to failure caused by twisting or rotation about a longitudinal axis 44 of the traces, where the traces typically run along the length of the flexible circuit substrate 28–34 between a set of electrodes 103 located at each end 48 of the flexible circuit substrate 28–34. The present invention solves this problem.

The connector 10 also includes a mechanical support 50 coupling the first and second clamps 24, 26 to each other. The support 50 can be any acceptable flexible member, such as a leaf spring, metal plate or other mechanical support, to significantly reduce twisting or rotation about the longitudinal axis 44 of the traces and flexible circuit substrates 28–34. Use of a leaf spring 50 for the support provides a resiliently deformable steel plate, having a prebuilt curve or camber 52 that permits translation along a longitudinal axis 56 while reducing rotation about the longitudinal axis 56. The curve is selected to permit easy manipulation of the connector 10 in space restricted areas, such as between PCBs 14, 16 inside super computers. The leaf spring 50 is designed in each application to be sufficiently stiff to support the weight of the clamps 24, 26. The stiffness is a function of the material, the thickness, width, length and curvature or camber of the leaf spring 50. The leaf spring 50 is made sufficiently stiff to prevent the weight of the first clamp 24 from causing twisting or rotating the flexible circuit substrates 28–34 about the longitudinal axis 56 if it is unclamped from the respective PCB 16 while the second clamp 26 is connected. Twisting can particularly be a problem when the PCBs 14, 16 are arranged as shown in FIG. 2, where gravity would tend to pull the clamp 24 downward if it is disconnected. The leaf spring 50 thus provides the mechanical support to ensure that the electrical connectors 28–42 are not destroyed when one of the clamps is disconnected and hangs free at one end.

The shape of the leaf spring 50 is selected to be strong, yet flexible. An enlarged portion 55 connects to the respective clamps 24 and 26. A necked down region 57 has a smooth curve to gradually reduce the body width 59 of the leaf spring to the desired value with the proper spring constant and flexibility, yet sufficient strength. The width and thickness of the body 59 are selected to provide the desired strength and flexibility. A wider and/or thicker body will have a higher spring constant and will be more stiff. A somewhat thinner leaf spring body 59 provides more flexibility yet less support strength. The width and thickness of the leaf spring body 59 is selected to provide the adequate strength and spring constant with sufficient flexibility based on the weight of the clamps and the respective orientation of the PCBs being connected.

The leaf spring 50 has a preselected spring bias loaded in a certain direction as manufactured. This is well-known for leaf springs, and upon manufacture can be predesigned to have a desired curvature and camber when unstretched, as will now be explained.

Figure 4:
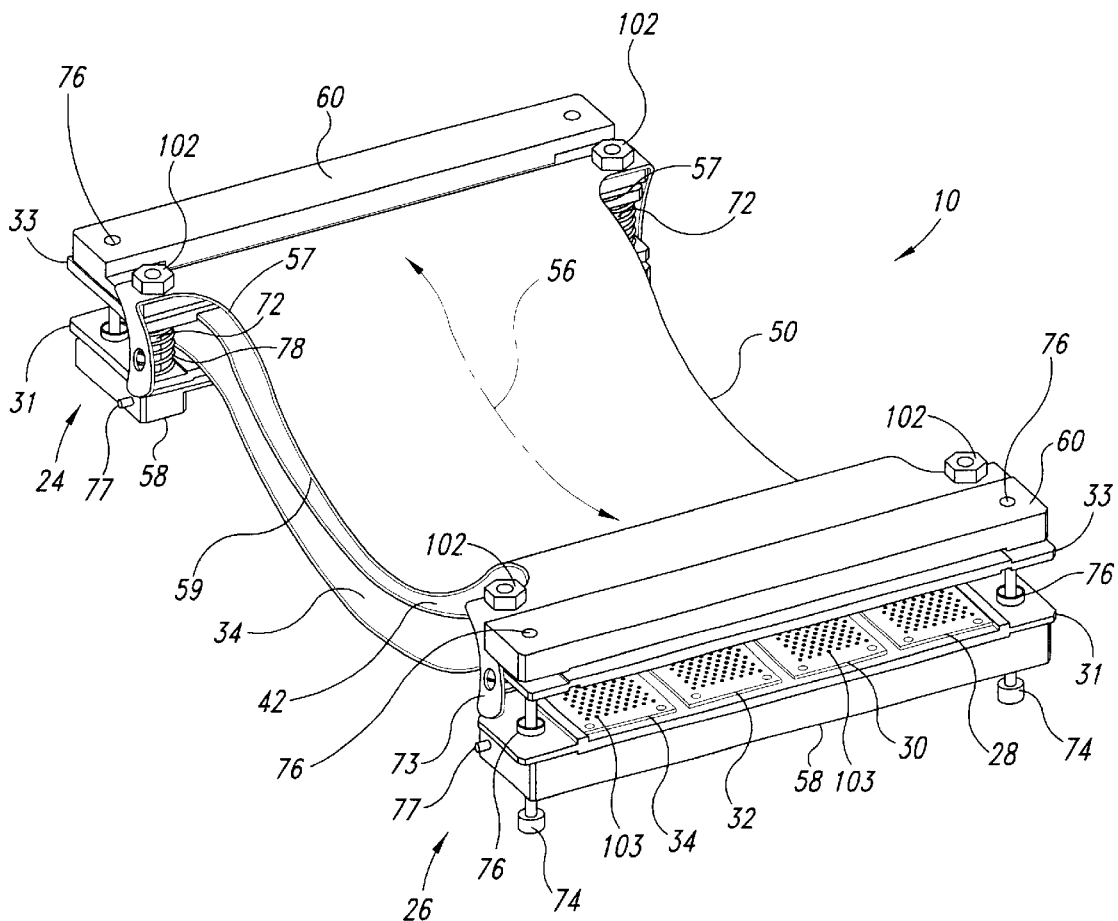
FIG. 4 is a partial, bottom, rear isometric view of the connector of FIG. 3.

FIGS. 3 and 4 illustrate examples of the leaf spring 50 in an unloaded and unstretched condition. The leaf spring 50 has a curvature and preset camber as determined when it was manufactured. The strength of its spring force is based on its width, thickness, and type of materials, as described herein. In an at-rest condition, the leaf spring 50 holds the clamps 24 and 26 a preselected distance away from each other. The electrical connectors 28–42 are assured of being retained in a smooth nonbinding relationship since they are held in position by the leaf spring 50. The electrical connectors 28–42 therefore will not twist, turn, or become entangled when at rest since the leaf spring extended between the clamps 24 and 26 with the support 50 holding them in a selected orientation. The connector 10 can thus remain at rest or be shipped from one location to another with high reliability and assurance that the electrical connectors 28–34 will not be damaged nor entangled.

The connector 10 is installed on the printed circuit boards 14 and 16 as follows. The connector 24 is positioned in the correct location to provide proper electrical contact to the printed circuit board 14 at the contact points on the printed circuit board. Alignment pins 76 in the connector extend through holes in the printed circuit board to ensure proper alignment. Frame members 31 and 33 hold the ends of the conductors 28–34 with the electrodes 103 thereon. While this alignment is being carried out, the leaf spring 50 holds the electrical connectors 28–34 in a firm, yet flexible orientation. The operator thus does not need to be concerned about entangling or damaging the electrical connectors while first clamp 24 is being aligned with the circuit board 14. Upon alignment being completed, the first connector 24 is coupled to a first printed circuit board 14 with the second end hanging free.

After the clamp 24 is connected, the user then connects clamp 26 to the other circuit board. This is done by stretching the leaf spring 50 so as to bias it in a spring-loaded condition. Once the leaf spring 50 is biased to its proper location, the clamp 26 is connected to the second printed board 16. The leaf spring 50 is thus in a loaded condition providing a resilient connection between the clamps 24 and 26 to the printed circuit boards 14 and 16. It is generally a very light spring force to not place an undue load on PCBs 14 and 16. The electrical connectors 28–34 thus do not carry the stress of supporting the clamps 24 and 26. The leaf spring 50 provides mechanical support for the electrical connectors so that they may rest upon the leaf spring and be supported thereby if desired. Other types of electrical connectors, such as the flexible circuit substrates, will be spaced above and generally not touch the leaf spring. In one embodiment, the electrical connectors are side by side as shown in FIGS. 1 and 2; in other embodiments, they may be spaced one above the other in a stacked relationship, as seen from connectors 28 and 36 having a space 38 therebetween, shown in FIG. 3.

FIGS. 3 and 4 show the first and second clamps 24, 26, and the flexible circuit substrates 28–34 in more detail than FIGS. 1 and 2. Only one of the clamps is described since the first and second clamps 24, 26 are similar structures. The clamps 24 and 26 each include a first clamping member 58 and a second clamping member 60 in opposed, spaced apart relation. The first and second clamping members 58, 60 are elongated metal plates with a surface for supporting electrical connectors therebetween.

The leaf spring 50 is bolted to the clamps 24 and 26 by a bolt 72 and a nut 102, best seen in FIG. 4. A spring clip 73 is coupled by bolt 72 and nut 102 to the clamping assembly 26. It has an aperture 75 which is aligned to mate with pin 77 when the clamp 26 is in the preloaded position.

Figure 6:
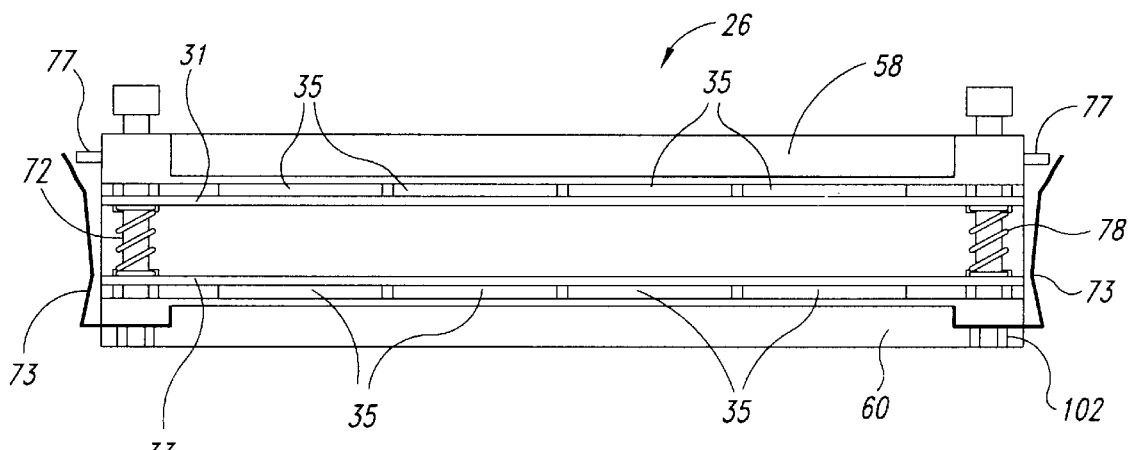
FIG. 6 is a front elevational view of the clamping assembly in a fully open position.

As shown in FIGS. 3, 4, and 6, a pair of coil compression springs 78 bias the first and second clamping members 58, 60 away from each other, toward an unclamped position. This holds the clamp 26 in the open position. The coil compression springs 78 are disposed about the rear fasteners 72, at the rear of the clamping members 58, 60 to retain the coil compression springs 78 on the respective clamping member 58,60. The spring clip 73 can be used to place the clamp 26 in the preloaded position, as will now be explained.

Figure 5:
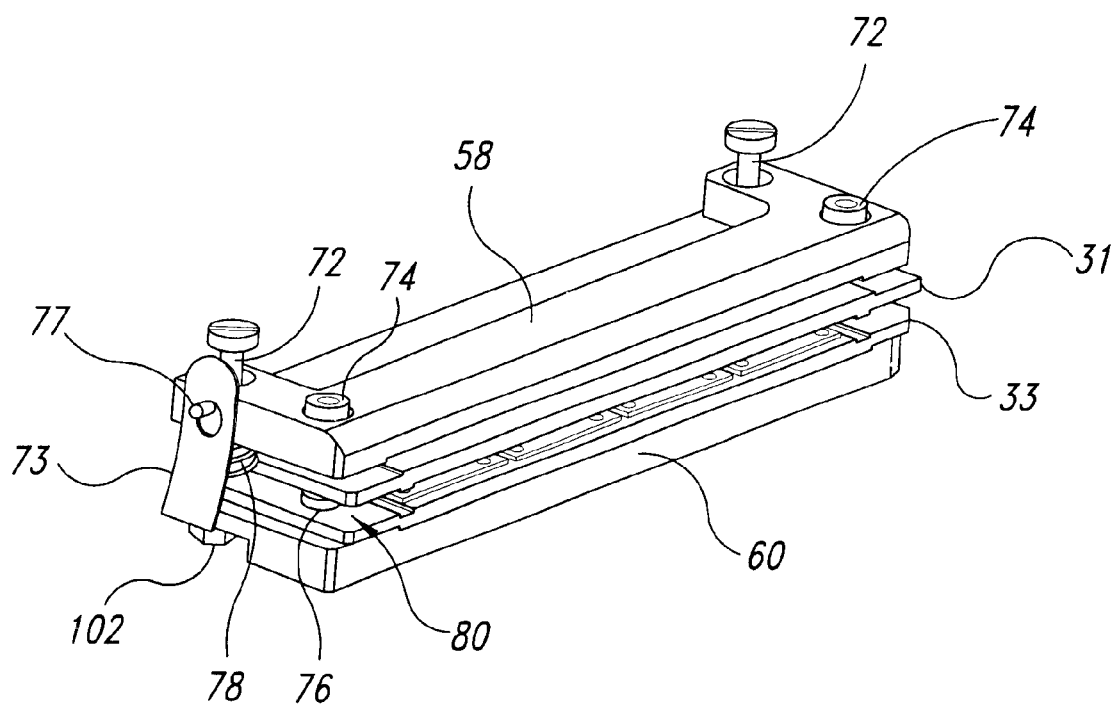
FIG. 5 is an isometric view of the clamp assembly in the preloaded condition, prior to final clamping.

FIG. 5 illustrates the clamping assembly 26 alone. It is shown in the preloaded position. The two front fasteners 74 are threaded and serve as the final fasteners at the front of the clamping members 58, 60 to hold the electrical connections in a solid position between the clamping members 58, 60. The rear fasteners 72 align the clamping members 58 and 60 in the open position. The threads of the front fasteners 74 engage a respective portion of the first and second clamping members 58, 60 to move the first and second clamping members 58, 60 with respect to one another. For example, a lower threaded portion of the front fasteners 74, see FIGS. 3 and 4, engages a thread in the hole 76 of the second clamping member 60, while an upper threaded portion of the front fastener 74 engages a thread in the hole 76 of the first clamping member 58. Thus, the distance or space 80 between the clamping members 58, 60 can be adjusted by rotating the front fasteners 74.

Figure 7:
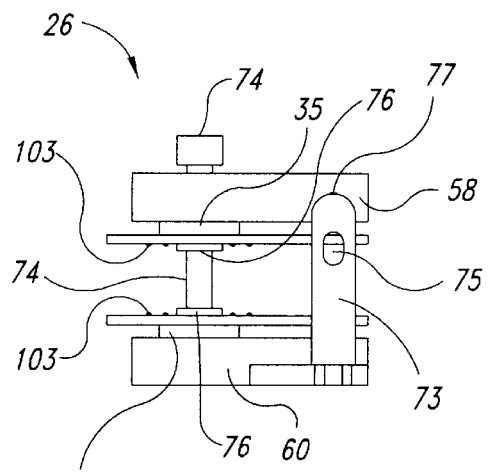
FIG. 7 is a side elevational view of the fully open position of FIG. 6.

The clamping assembly 26 is designed to provide quick and easy clamping, and has significant advantages as will now be explained. The clamp 26 as shown in FIGS. 3, 4 and 6 is in the fully open position. The open position is characterized by fastener 72 at the rear of the clamp holding the two clamp members 58 and 60 connected to each other with a solid connection. Spring 78 biases the clamping members 58 and 60 away from each other to hold the clamp in the fully open position. Spring clip 73 connected to the clamping member 68 is not connected to the other clamping member 58 so that the two clamping members are held together by the rear fastener 72. Since the spring 78 is biasing it into the open position, a user may easily grasp the clamp and position it over a printed circuit board with good clearance on each side so that it may be quickly and easily positioned. Once the clamp 26 is positioned over the edge of the printed circuit board, it is advanced from the fully open position to the preloaded position, see FIGS. 5 and 7. This is accomplished by slightly depressing clamping member 58 towards clamping member 60, compressing spring 78.

The connecting sequence can be seen by comparing FIGS. 6, 7, 8 and 9. As clamping member 58 is compressed, pin 77 contacts spring clip 73 and slowly pushes it away from the clamping member 58. As the clamping member 58 continues to be depressed, the pin 77 enters aperture 75 of spring clip 73. Once it enters aperture 75, the spring clip 73 will hold the clamp 26 in the preloaded position, FIG. 8.

Figure 8:
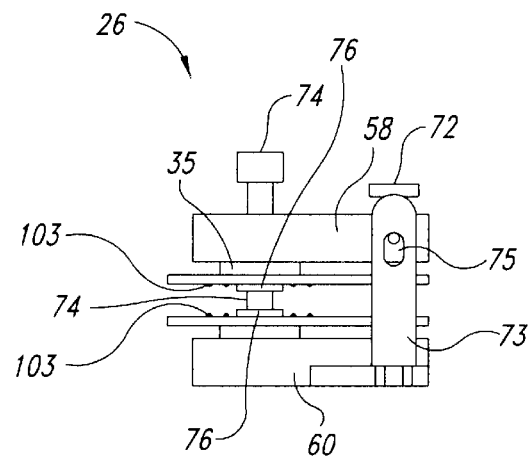
FIG. 8 is a side elevational view of the clamp assembly in a preloaded condition, ready for clamping.

While the user, whether manually by hand or via a robot is depressing the clamp 26, it is carefully held in position so that alignment posts 76 are properly positioned in the printed circuit board. Other alignment posts or alignment members may also be positioned from the clamp 26 to the printed circuit board 14, or from the printed circuit board 14 to the clamp 26. Thus, in the fully open position there is no connection between the clamping assembly 26 and the printed circuit board 14. As it is advanced to the preloaded position, the alignment members of the clamping assembly 26 and the printed circuit board 14 are aligned with each other so that in the preloaded condition, the clamping assembly is held in a properly aligned position on the printed circuit board. This position is shown in FIG. 8. The spring clip 73 is retaining the clamping members 58 and 60 in a relative position with each other while the fastener 72 provides proper horizontal and vertical alignment but does not provide compression force to hold the clamping members to each other. The spring clip 73 holds with sufficient strength to overcome the compression spring 78.

Figure 9:
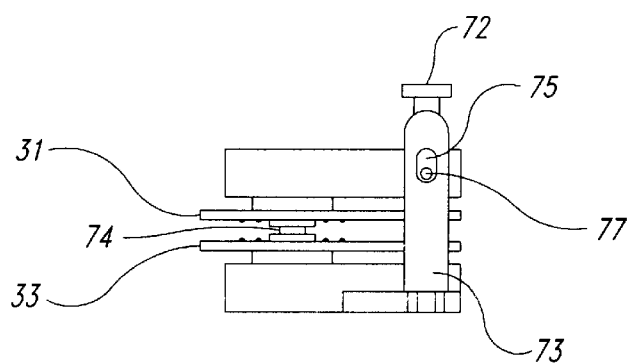
FIG. 9 is a side elevational view of the clamping assembly in a fully clamped position.

The clamp 26 can be held in the preloaded position for an extended period of time if desired until it is time for the fasteners 74 to connect the clamp in a locked position. When the clamping assembly 26 is to be fully attached in the clamped position to the printed circuit board 14 then fasteners 74 are threaded down tightly to firmly press clamping member 58 and 60 into each side of the printed circuit board. Electrodes 103 are held in firm contact with the corresponding exposed electrodes on the printed circuit board as the fastener 74 is threaded tightly down to clamp the clamping assembly 26 firmly to the printed circuit board 14. This locked, final clamp position is shown in FIG. 9. The printed circuit board has been omitted in FIGS. 6–9 for ease in illustration. However, as will be appreciated during use, the printed circuit board 14 is positioned within the clamping assembly 26 between frame members 31 and 33. Rubber pads 35 press the frame 31 and 33 with the conductors 28–42 thereon into engagement with printed circuit board 14. The electrical connections are thus properly made from the connectors 28–42 to the circuit board 14 via the electrode 103. In this final clamped position, the fasteners 74 are holding members 58 and 60 to each other and the spring clip 73 is not needed to provide this function. The spring clip 73 held the clamp in the correctly aligned, preloaded position so that fastener 74 could be quickly and easily attached with a high degree of assurance that the circuit board 14 would be properly aligned with its electrodes contacting those on the clamping assembly 26.

The clamping assembly 26 remains on the printed circuit board for an extended period of time as desired. When it is desired to remove the clamping assembly 26 from the printed circuit board, the operation is carried out in reverse. The threaded fasteners 74 are removed from holding clamping members 58 and 60 to each other. This slowly releases the clamping members 58 and 60 in a controlled fashion as compression spring 78 pushes the clamps away from each other. Spring clip 73, which still engages pin 77 through its aperture 75 continues to hold clamping members 50 and 60 in the preloaded condition. The clamping member is still properly aligned and the electrodes 103 are still properly aligned with the electrodes on the printed circuit board 14 so that no damage is done as the clamping assembly 26 is removed from the printed circuit board. When it is desirable to provide complete removal of the clamping assembly 26 from the printed circuit board the spring clips 73 are pushed laterally away from member 58 so that pin 77 is disengaged from aperture 75. Once pin 77 is disengaged from aperture 75, then compression springs 78 force clamping member 58 and 60 further away from each other so they are stopped and held in position by the head of the fastener 72. The clamping assembly 26 is now in the fully open position and the clamp can be removed from the printed circuit board 14 under control of the user and the leaf spring 50 as will now be explained.

The leaf spring 50 remains in its spring-loaded condition while the circuit boards 14 and 16 are within the housing of the computer, normally a supercomputer which may have dozens of such boards therein. At some time, it may be necessary to remove one of the boards 16 from the super computer and replace it with a different board. The connector 10 makes such a change quick and easy, while assuring that no damage will be done to the electrical connectors 28–42 or to any adjacent boards. According to principles of the present invention, the clamp 26 is loosened and removed from the board 16. The operator can then let go of the clamp 26 and let one end hang free so that the entire connector 10 is supported by the circuit board 14. The leaf spring 50, since it is preshaped, will automatically move back to the rest position and thus will spring away from circuit board 16 in a motion which does not interfere with or impact other portions of the circuit board 16. The clamp 26 thus is automatically swung free by the retraction of the leaf spring 50 and can be assured of not impacting or causing damage to other locations inside the supercomputer when it is not connected. The leaf spring 50 returns to its rest condition and holds the clamp 26 in a suspended location determined by the preset shape of the spring 50 when manufactured, as previously discussed. The clamp 26 can thus hang free for an extended period of time while the electrical connectors 28–42 are supported without fear of entanglement or damage. When a new board 16 is provided in the slot in the supercomputer, it is slid into location quickly and easily. Since the clamp 26 is held by the leaf spring 50 in a preset position, the user can be assured of inserting the board 16 smoothly and cleanly without becoming entangled in the electrical connectors. Once the board is in place, the operator engages the clamp 26 onto the board 16 by stretching the leaf spring 50 as desired and clamping the connector 10 to the board 16. The electrical connection is thus quickly and cleanly made to the circuit board 16 and operation of the supercomputer continues. Indeed, if used in a super computer, the invention may permit it to remain operating while the board is being replaced, and the connector 10 assures that no damage to the electrical circuits nor interference with other boards will occur during the replacement.

In an alternative embodiment, the mechanical support 50 is not a leaf spring. Instead it is a support member that holds the electrical connectors in a safe position to prevent damage to the wires or tangling of wires. Thus, in the embodiment when the connector 50 is not a spring, it will hold the clamps 24 and 26 in the proper position, as well as the electrical wires 28–34 but it will not spring back into position to automatically swing away from the board 26 when it is unclamped.

Although specific embodiments of and examples for, the invention are described herein for illustrative purposes, various equivalent modifications can be made without departing from the spirit and scope of the invention, as will be recognized by those skilled in the relevant art. The teachings provided herein of the invention can be applied to other electrical connectors, not necessarily the exemplary clamping electrical connector generally described above. Aspects of the invention can be modified, if necessary, to employ systems, circuits and concepts of the various patents, applications and publications to provide yet further embodiments of the invention.

We claim:

1. A method of attaching an electrical connector to a circuit board comprising:
   positioning a clamp assembly having electrodes therein in an aligned position over electrodes of a circuit board;
   closing the clamp assembly into a preloaded position having alignment members extending between the clamp assembly and the circuit board;
   holding the clamp assembly in the preloaded position by a spring clip extending from a first clamp member to a second clamp member; and
   firmly closing the clamp assembly onto the printed circuit board with the electrodes of the clamp assembly in electrical contact with the electrodes of the circuit board.

2. The method according to claim 1 further including:
   placing alignment members in the clamp assembly into alignment apertures in the circuit board to properly align the electrodes of the clamp assembly with the electrodes of the circuit board.

3. The method according to claim 1 further including:
   holding the clamping assembly with the first clamp member and the second clamp member spaced from each other in an open position while the clamp assembly is being positioned over the circuit board.

4. The method according to claim 3 wherein the clamp assembly is held in the open position by a compression spring which applies a force to push the clamping members away from each other.

5. A clamping assembly for attachment to a circuit board comprising:
   a first clamp member;
   a second clamp member spaced from the first clamp member;
   a first fastener that couples the first clamp member to the second clamp member;
   a spring positioned between the first clamp member and the second clamp member and providing a force to push them apart from each other, such that they are held a first distance from each other in an open position;
   a retaining member coupled to the second clamping member and positioned for connecting to the first clamping member when the first and second clamping members are spaced a second distance from each other that is less than the first distance to hold the clamping assembly in a partially closed, preloaded position;
   a second fastener coupling the first member to the second member in a closed, clamped position onto the circuit board.

6. The clamp assembly according to claim 5 further including a pin extending from the first clamp member and positioned to mate with the retaining member.

7. The clamp assembly according to claim 5 wherein the retaining member includes a spring clip having an aperture therein that is selectively connected to the first clamp member to retain the first clamp member and the second clamp member the second distance apart from each other.

8. The clamping assembly of claim 6 further including:
a frame member positioned between the first and second clamp members having electrodes thereon positioned for contacting electrodes on the circuit board.

9. The clamp assembly according to claim 5 wherein the spring is a compression spring positioned between the first and second members.

10. The clamp assembly according to claim 9 wherein the first fastener is positioned inside of the compression spring extending from the first clamp member to the second clamp member.

11. The clamp assembly according to claim 5 further including:
alignment members extending between the clamping assembly to align with alignment members on the circuit board.

12. The clamp assembly according to claim 11 wherein the alignment members are positioned on the clamping assembly and include posts extending from the clamping assembly.

13. The clamp assembly according to claim 12 further including apertures in the circuit board positioned to mate with the posts extending from the clamping assembly.

14. A clamp assembly for attachment to a circuit board comprising:
first and second clamping members;
a pair of biasing members positioned between the first and second clamping members for spacing the first clamping member apart from the second clamping member in a normally open configuration;
a pair of first retaining members coupled between the first and second clamping members for limiting the spacing between the first and second clamping members to a first distance;
a pair of second retaining members coupled to the second clamping member and structured for coupling to the first clamping member for limiting the spacing between the first and second clamping members to a second distance that is less than the first distance, whereby the first and second clamping members are configured in a partially closed and preloaded configuration; and
a pair of third retaining members coupled between the first and second clamping members for limiting the spacing between the first and second clamping members to a third distance that is less than the second distance, whereby the first and second clamping members are configured in a closed configuration.

15. The clamp assembly according to claim 14 further including a pair of pins extending from the first clamping member, each of the pair of pins positioned to mate with one of the pair of second retaining members.

16. The clamp assembly according to claim 14 wherein each of the pair of second retaining members includes a spring clip having an aperture therein that is structured to be connected to the first clamping member to retain the first and second clamping members spaced apart the second distance.

17. The clamp assembly of claim 14 further including a frame member positioned between the first and second clamping members, the frame member having electrodes positioned thereon for contacting electrodes formed on the circuit board.

18. The clamp assembly according to claim 14 wherein each of the pair of biasing members is a compression spring.

19. The clamp assembly according to claim 18 wherein:
each of the compression springs is a coil spring; and
each of the pair of first retaining members is a first fastener that is positioned within the coil spring and extends between the first and second clamping members.

20. The clamp assembly according to claim 14 further including one or more alignment members extending from the first clamping member toward the second clamping member to align with alignment members on the circuit board.

21. The clamp assembly according to claim 20 wherein the alignment members are posts extending from the first clamping member toward the second clamping member.

22. The clamp assembly according to claim 21 wherein the posts extending from the first clamping member are structured to mate with apertures formed in the circuit board.

* * * * *